United States Patent [19]

Asano

[11] Patent Number: 5,533,243
[45] Date of Patent: Jul. 9, 1996

[54] NOTCH POSITION ALIGNING APPARATUS AND PROCESS FOR USING THE APPARATUS TO INDEPENDENTLY ALIGN INDIVIDUAL WAFERS IN A WAFER CASSETTE

[75] Inventor: Takanobu Asano, Yokohama, Japan

[73] Assignees: Tokyo Electron Limited, Tokyo; Tokyo Electron Tohoku Limited, Esashi, both of Japan

[21] Appl. No.: 365,429

[22] Filed: Dec. 28, 1994

[30] Foreign Application Priority Data

Dec. 28, 1993 [JP] Japan .................................. 5-352038

[51] Int. Cl.[6] .............................. B23B 5/22; B65G 47/24
[52] U.S. Cl. ..................... 29/25.01; 437/925; 414/936; 414/938; 414/433; 414/757; 414/786; 269/289 MR; 269/903
[58] Field of Search ..................... 414/936, 938, 414/433, 757, 758; 29/25.01; 437/925; 269/289 MR, 903

[56] References Cited

U.S. PATENT DOCUMENTS

| 4,570,058 | 2/1986 | Hauassy | 235/479 |
|---|---|---|---|
| 4,662,811 | 5/1987 | Hayden | 414/433 |
| 4,778,382 | 10/1988 | Sakashita | 432/239 |
| 4,813,840 | 3/1989 | Prabhakar et al. | 414/936 |
| 4,970,772 | 11/1990 | Steere, III | 29/271 |
| 5,183,378 | 2/1993 | Asano et al. | 414/757 |
| 5,205,028 | 4/1993 | Leonard | 29/271 |
| 5,383,759 | 1/1995 | Lin | 414/257 |

FOREIGN PATENT DOCUMENTS

| 61-214445 | 9/1986 | Japan . |
|---|---|---|
| 62-115738 | 5/1987 | Japan . |
| 63-213940 | 9/1988 | Japan . |
| 63-265444 | 11/1988 | Japan . |
| 1309348 | 12/1989 | Japan . |
| 430554 | 2/1992 | Japan . |
| 4148717 | 5/1992 | Japan . |
| 5259264 | 10/1993 | Japan . |

Primary Examiner—George Fourson
Assistant Examiner—David E. Graybill
Attorney, Agent, or Firm—Oblon, Spivak, McClelland, Maier & Neustadt

[57] ABSTRACT

According to this invention, there is provided a notch position aligning mechanism and a process for using the mechanism including a base which can be vertically movably inserted into a cassette through a lower opening of the cassette for storing a plurality of targets to be aligned having notches formed in edge portions of the targets wherein can be fitted, a rotating/supporting mechanism, including a first rotary member which is arranged on the base, and has a plurality of fitting grooves in which the notches of the targets can be fitted, a second rotary member which can be rotated and is arranged on the base, and a drive unit for rotating at least one of the first and second rotary members, the rotating/supporting mechanism supporting and rotating the targets using the first and second rotary members while the targets are spaced apart from the cassette, and a support member, arranged on the base, for supporting the targets having the notches fitted in the fitting grooves of the first rotary member to stop rotations of the targets.

9 Claims, 6 Drawing Sheets

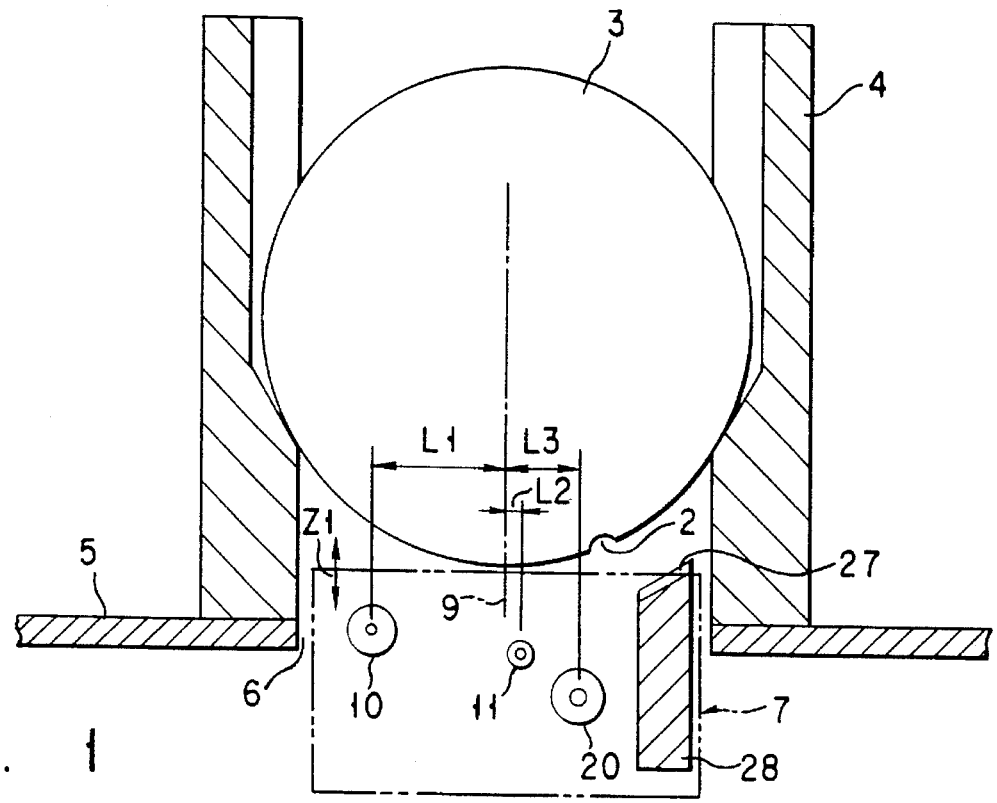
FIG. 1
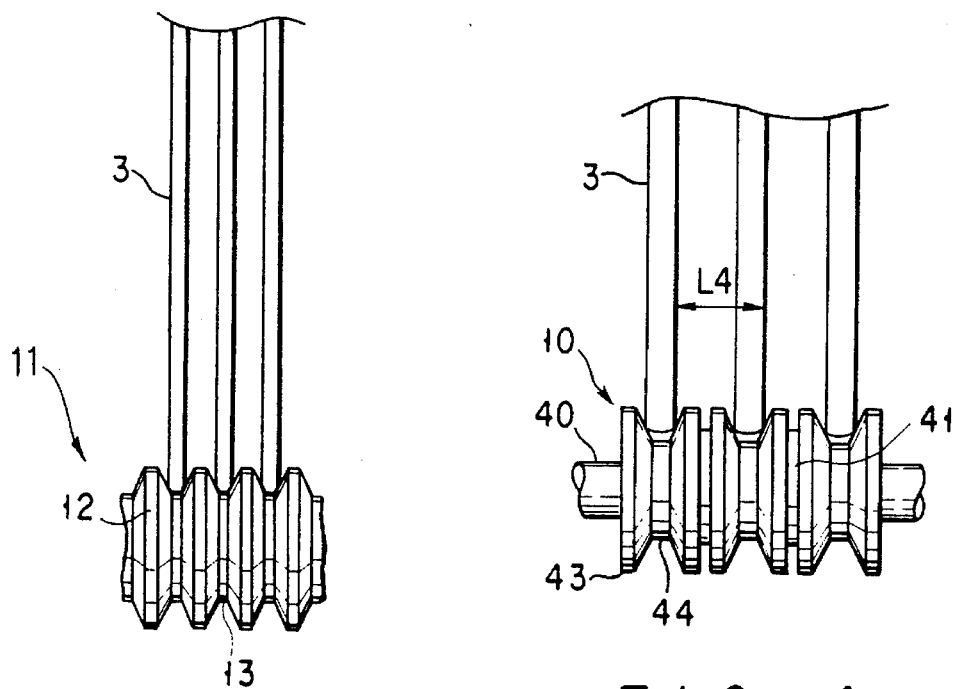
FIG. 3
FIG. 4

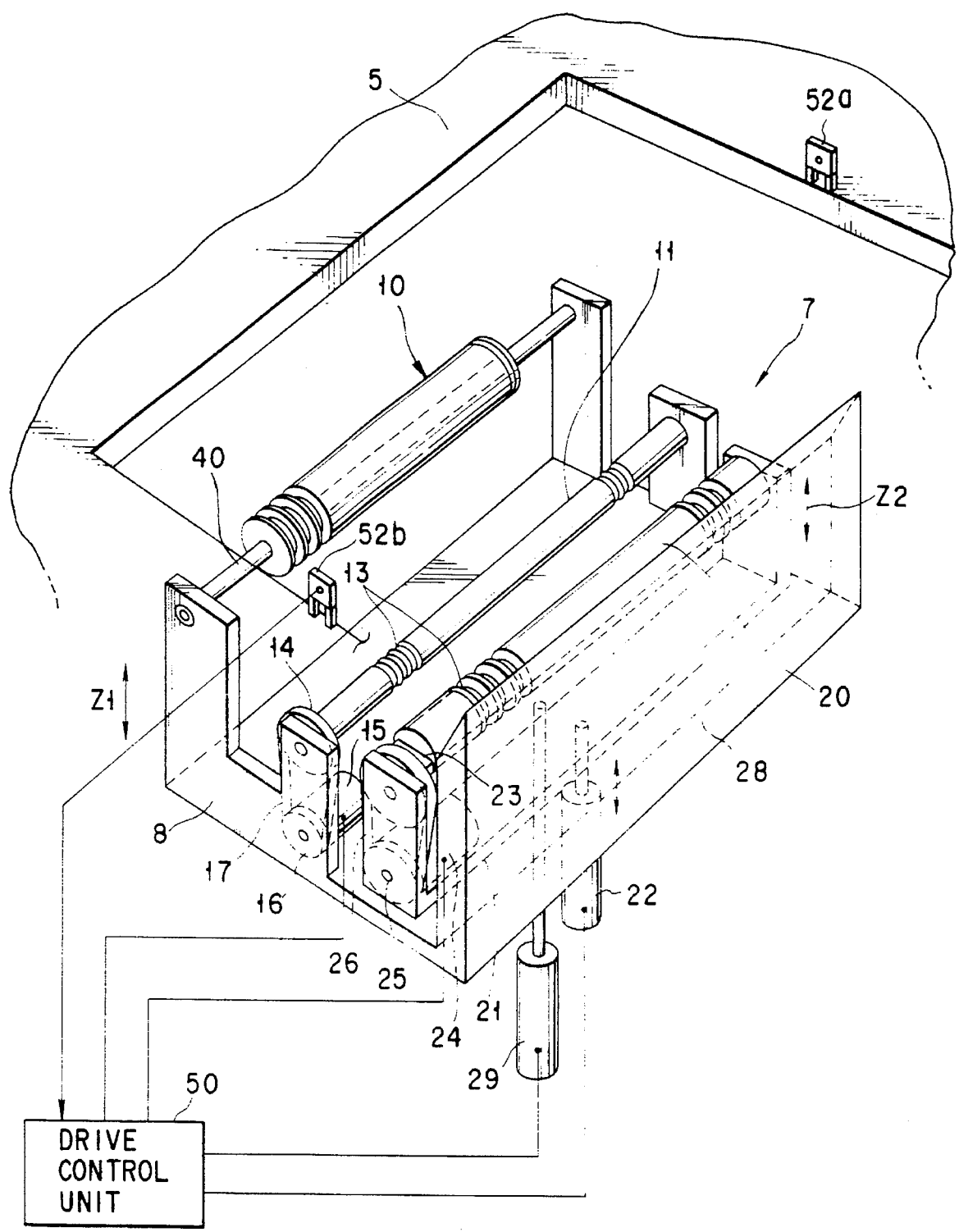
F I G. 2

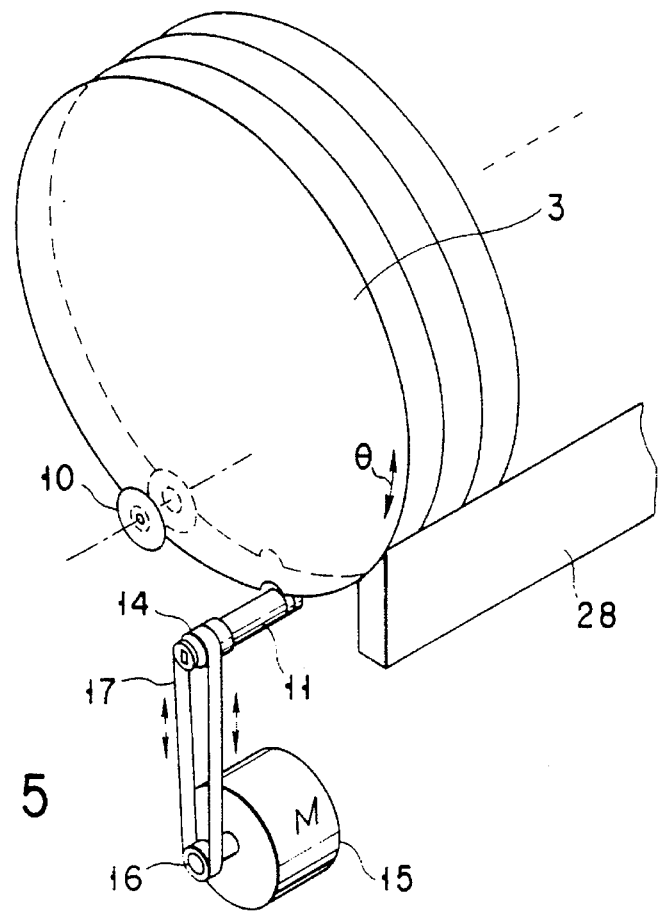
F I G. 5
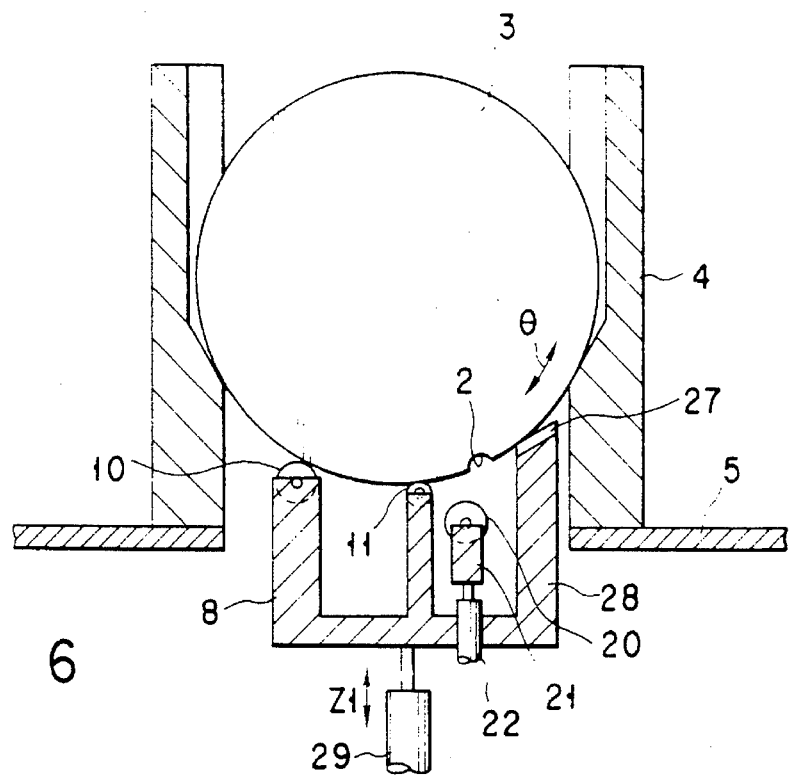
F I G. 6

NOTCH POSITION ALIGNING APPARATUS AND PROCESS FOR USING THE APPARATUS TO INDEPENDENTLY ALIGN INDIVIDUAL WAFERS IN A WAFER CASSETTE

BACKGROUND OF THE INVENTION

1. Field of the Invention

The present invention relates to a notch position aligning mechanism in which the positions of notches formed in the edge portions of a plurality of targets to be aligned, such as semiconductor wafers, are aligned in a predetermined direction.

2. Description of the Related Art

IBM Technical Disclosure Bulletin Vol. 14, No. 8 issued in January 1972 discloses a technique in which semiconductor wafers (to be referred to as wafers hereinafter) serving as targets to be aligned having notches each having a radius of about 5 mm and formed in the edge portions of the wafers are stored in a cassette, and these semiconductor wafers are aligned in a predetermined state. According to this technique, a plurality of wafers stored in a cassette are lifted upward by a uniaxial roller having a diameter smaller than the diameter of the notch of each wafer, and the notches of the wafers are fitted on the roller by rotating the roller, thereby aligning the wafers.

However, when the wafers stored in the cassette are lifted upward by the uniaxial roller, the wafers cannot be supported by only the contact with the uniaxial roller. For this reason, the wafers are brought into contact with the wafer storing grooves of the cassette. In this state, when the roller is rotated, the wafers are rotated with the rotation of the roller, and the edge portions of the wafers are rubbed with the wafer storing grooves of the cassette with the rotation of the wafers. When the edge portions of the wafers are rubbed with the wafer storing grooves, a film formed on each wafer is peeled, or the wafers are damaged. As a result, dust generated by peeling of the films or damage to the wafers floats in the air, and this dust adheres to devices formed on each wafer, thereby decreasing the yield of the devices.

After the notches of the wafers are fitted on the uniaxial roller to align the wafers, the uniaxial roller cannot easily move the notches of the wafers to a predetermined position, e.g., a position which is located immediately above the roller and opposes the roller.

SUMMARY OF THE INVENTION

It is an object of the present invention to provide a notch position aligning mechanism in which a plurality of targets to be aligned having notches formed in the edge portions of the targets can be easily, reliably aligned, and, during this aligning operation, contact between the targets and other members can be suppressed.

The object of the present invention can be achieved by the following notch position aligning mechanism. That is, there is provided a notch position aligning mechanism comprising a base which can be vertically movably inserted into a cassette through a lower opening of the cassette for storing a plurality of targets to be aligned having notches formed in edge portions of the targets, rotating/supporting means, including a first rotary member which can be rotated, is arranged on the base, and has a plurality of fitting grooves in which the notches of the targets can be fitted, a second rotary member which can be rotated and is arranged on the base, and driving means for rotating at least one of the first and second rotary members, the rotating/supporting means supporting and rotating the targets using the first and second rotary members while the targets are spaced apart from the cassette, and a support member, arranged on the base, for supporting the targets having the notches fitted in the fitting grooves of the first rotary member to stop rotation of the targets.

According to the notch position aligning mechanism having the above arrangement, the plurality of targets can be supported by the first and second rotary members while the targets are spaced apart from the cassette, and the targets can be rotated by causing the driving means to rotate, e.g., the first rotary member. For this reason, the targets can be stably rotated in a predetermined posture without being in contact with the cassette.

In addition, the notch position aligning mechanism having the above arrangement may further comprise a third rotary member. This third rotary member is vertically movably arranged in the base and can support and rotate the targets having the notches fitted in the fitting grooves of the first rotary member while the targets are spaced apart from the first rotary member, in cooperation with the second rotary member. With this arrangement, the notches of the plurality of targets arranged in a straight line can be reliably moved to a predetermined position, thereby decreasing an apparatus or system in size.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is a schematic sectional view showing a manner wherein a notch position aligning mechanism according to an embodiment of the present invention is moved into a cassette through the opening of the cassette in which a plurality of targets to be aligned are stored;

FIG. 2 is a schematic perspective view showing the notch position aligning mechanism in FIG. 1;

FIG. 3 is a partial enlarged view showing a driving rotary member of the notch position aligning mechanism in FIG. 1;

FIG. 4 is a partial enlarged view showing a driven rotary member of the notch position aligning mechanism in FIG. 1;

FIG. 5 is a schematic perspective view showing a state wherein wafers are supported by a drive shaft and idle pulleys of the notch position aligning mechanism in FIG. 1;

FIG. 6 is a schematic sectional view showing a state wherein wafers are supported by the drive shaft and idle pulleys of the notch position aligning mechanism in FIG. 1;

DETAILED DESCRIPTION OF THE PREFERRED EMBODIMENTS

Figure 7:
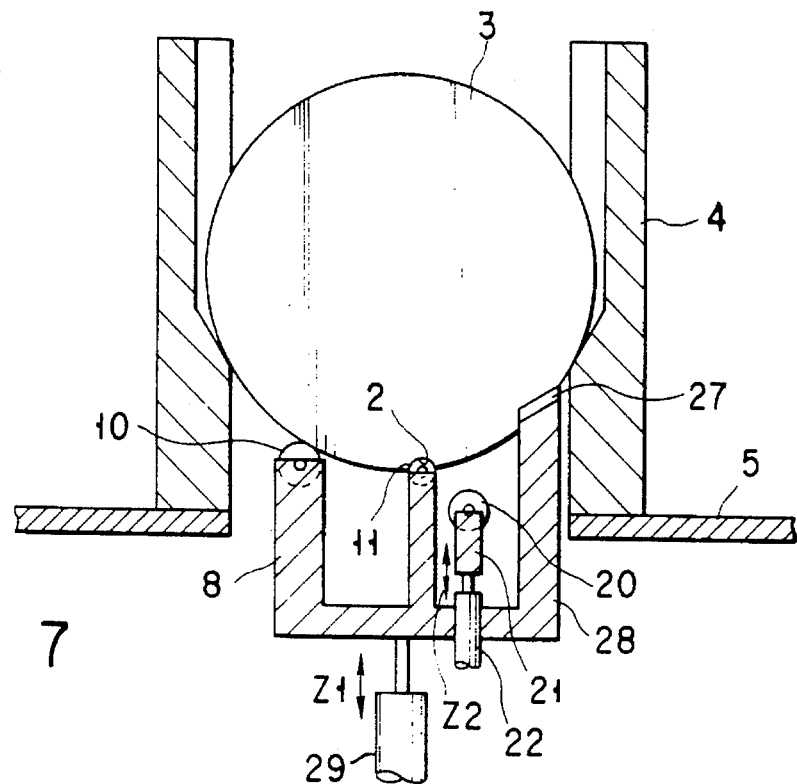
FIG. 7 is a schematic sectional view showing a state wherein notches of the wafers are fitted in annular grooves of the drive shaft of the notch position aligning mechanism in FIG. 1.
Figure 8:
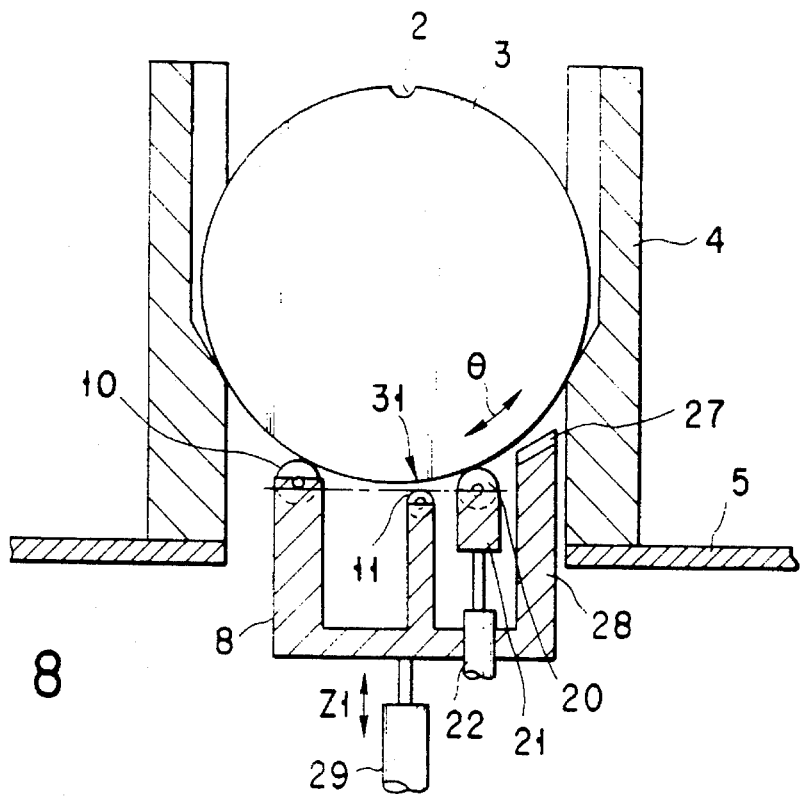
FIG. 8 is a schematic sectional view showing a state wherein the notches of the wafers arranged in a straight line are moved to the upper portion of the wafers by a notch moving shaft of the notch position aligning mechanism in FIG. 1.

A notch position aligning mechanism according to an embodiment of the present invention will be described below with reference to the accompanying drawings.

FIG. 1 shows a state wherein a plurality of semiconductor wafers (to be referred to as wafers hereinafter) 3 serving as targets to be aligned are stored in a cassette 4. The wafers 3 have notches 2 each having a radius of 5 mm and formed in the edge portion of the wafer 3. For example, 25 wafers are stored as one set in the cassette 4. The cassette 4 consists of a hard resin such as a fluoroplastic, and is mounted on a base 5 serving as a cassette mounting base.

An opening 6 communicating with the cassette 4 is formed in the base 5, and a notch aligning mechanism 7 which can be inserted into the cassette 4 through the opening 6 is arranged to be vertically movable (Z1 direction).

As shown in FIG. 2, the notch aligning mechanism 7 comprises a base 8 on which two members for aligning the wafers 3, i.e., a drive shaft 11 and a driven rotary member 10 are arranged. A drive shaft of an air cylinder 29 for moving the base 8 in the vertical direction (Z1 direction) is connected to the bottom portion of the base 8. 10 The drive shaft 11 (first (driving) rotary member) is spaced apart from a central line 9 (FIG. 1) of the wafers 3 in the right direction (FIG. 1) by a predetermined distance, e.g., a distance corresponding to almost ¼ (L2) the radius of each wafer. The drive shaft 11 has a diameter which is almost equal to the diameter of the notch 2 of each wafer 3, e.g., 6 to 7 mm. In consideration of contamination of the wafers 3, the drive shaft 11 consists of stainless steel, and a polytetrafluoroethylene-based coating is formed on the surface of the drive shaft 11. As shown in FIG. 3, the main body of the drive shaft 11 is constituted by a trunk portion 12 serving as a long shaft member, and annular grooves 13 are formed in the outer surface of the trunk portion 12. The annular grooves 13 are formed over almost the entire length of the trunk portion 12, and each annular groove 13 has a width larger than the thickness of each wafer 3 to store the edge portion of the wafer 3.

As shown in FIG. 1, the driven rotary member 10 (second rotary member) is spaced apart from the central line 9 of the wafers 3 in the left direction (FIG. 1) by a predetermined distance, e.g., a distance corresponding to almost ½ (L1) the radius of each wafer. The driven rotary member 10 has a plurality of idle pulleys 43 consisting of a hard resin such as a fluoroplastic, and these idle pulleys 43 can be rotated while being in contact with the circumferential surfaces of the wafers 3. More specifically, the driven rotary member 10 is arranged at a level higher than that of the drive shaft 11 such that the idle pulleys 43 can be rotated together with the wafers 3 while the drive shaft 11 is in contact with the wafers 3 by moving the base 8 upward.

As shown in FIG. 4, the driven rotary member 10 is constituted by a stationary shaft 40 consisting of, e.g., stainless steel, and the plurality of idle pulleys 43 concentrically arranged on the stationary shaft 40 at an interval corresponding to the arrangement interval (L4) of the wafers 3. Note that, in this case, the idle pulleys 43 can be independently rotated on the stationary shaft 40. In addition, the idle pulleys 43 are arranged over almost the entire length of the stationary shaft 40, and consist of, e.g., a polytetrafluoroethylene material. In order to prevent the idle pulleys 43 from being shifted in a longitudinal direction of the stationary shaft 40, a washer 41 consisting of, e.g., polytetrafluoroethylene, is interposed between the adjacent idle pulleys 43. An annular groove 44 of each idle pulley 43 has a width larger than the thickness of each wafer 3 to store the edge portion of the wafer 3. With the above arrangement, the plurality of wafers 3 can be respectively supported by the idle pulleys 43, and the wafers 3 can be independently rotated. Note that the annular groove 44 of each idle pulley 43 is formed to have a size set to prevent the notch of each wafer 3 from being fitted in the annular groove 44.

As shown in FIGS. 2 and 5, a ring-like pulley 14 is arranged on an end portion of the drive shaft 11. A motor 15 serving as a rotational driving means for rotationally driving the drive shaft 11 is arranged on the base 8. A rotary shaft 16 of the motor 15 is coupled to the pulley 14 through a belt 17, thereby transmitting a rotating force from the rotary shaft 16 of the motor 15 to the pulley 14 through the belt 17. In this arrangement, when the belt 17 is driven with the rotation of the rotary shaft 16 of the motor 15, the drive shaft 11 is rotated together with the pulley 14. With the rotation of the drive shaft 11, the plurality of wafers 3 lifted upward by the driven rotary member 10 and the drive shaft 11 are rotated in θ direction.

As shown in FIGS. 2 and 6, in the base 8, a notch moving shaft 20 (third (driving) rotary member) constituting the notch aligning mechanism 7 is arranged such that the notch moving shaft 20 can be brought into contact with the wafers 3 along the circumferential surfaces thereof. The notch moving shaft 20 is spaced apart from the central line 9 of the wafers 3 in the right direction (FIG. 1) by a predetermined distance, e.g., a distance corresponding to almost ½ (L3) the radius of each wafer. The notch moving shaft 20 is mounted on a base 21 moved by an air cylinder 22 in the vertical direction (Z2 direction). In this case, A drive shaft of the air cylinder 22 is connected to the lower surface of the base 21.

As shown in FIG. 3, the main body of the notch moving shaft 20 is constituted by a trunk portion 62, and annular grooves 63 are formed in the outer surface of the trunk portion 62. Each annular groove 63 has a width larger than the thickness of each wafer 3. In addition, each annular groove 63 is formed to have a size set such that the notch 2 of each wafer 3 is not fitted in the annular groove 63.

As shown in FIG. 2, an annular groove 23 is formed in the outer surface of an end portion of the notch moving shaft 20. A rotational driving means, e.g., a motor 24, for rotationally driving the notch moving shaft 20 is arranged on the base 21. A rotary shaft 25 of the motor 24 is coupled to the annular groove 23 through a belt 26, thereby transmitting a rotating force from the rotary shaft 25 of the motor 24 to the notch moving shaft 20 through the belt 26. In this arrangement, when the belt 26 is driven with the rotation of the rotary shaft 25 of the motor 24, the notch moving shaft 20 is rotated, thereby rotating the wafers 3 lifted upward by the notch moving shaft 20.

As shown in FIGS. 1 and 2, on the right side (FIG. 1) of the notch moving shaft 20, a support member 28 serving as a stopper is formed integrally with the base 8. The support member 28 has grooves 27 serving as stoppers for supporting the wafers 3 to stop the rotation of the wafers 3 when the wafers 3 are shifted downward such that the notches 2 of the wafers 3 are fitted in the grooves 13 of the drive shaft 11.

Figure 9:
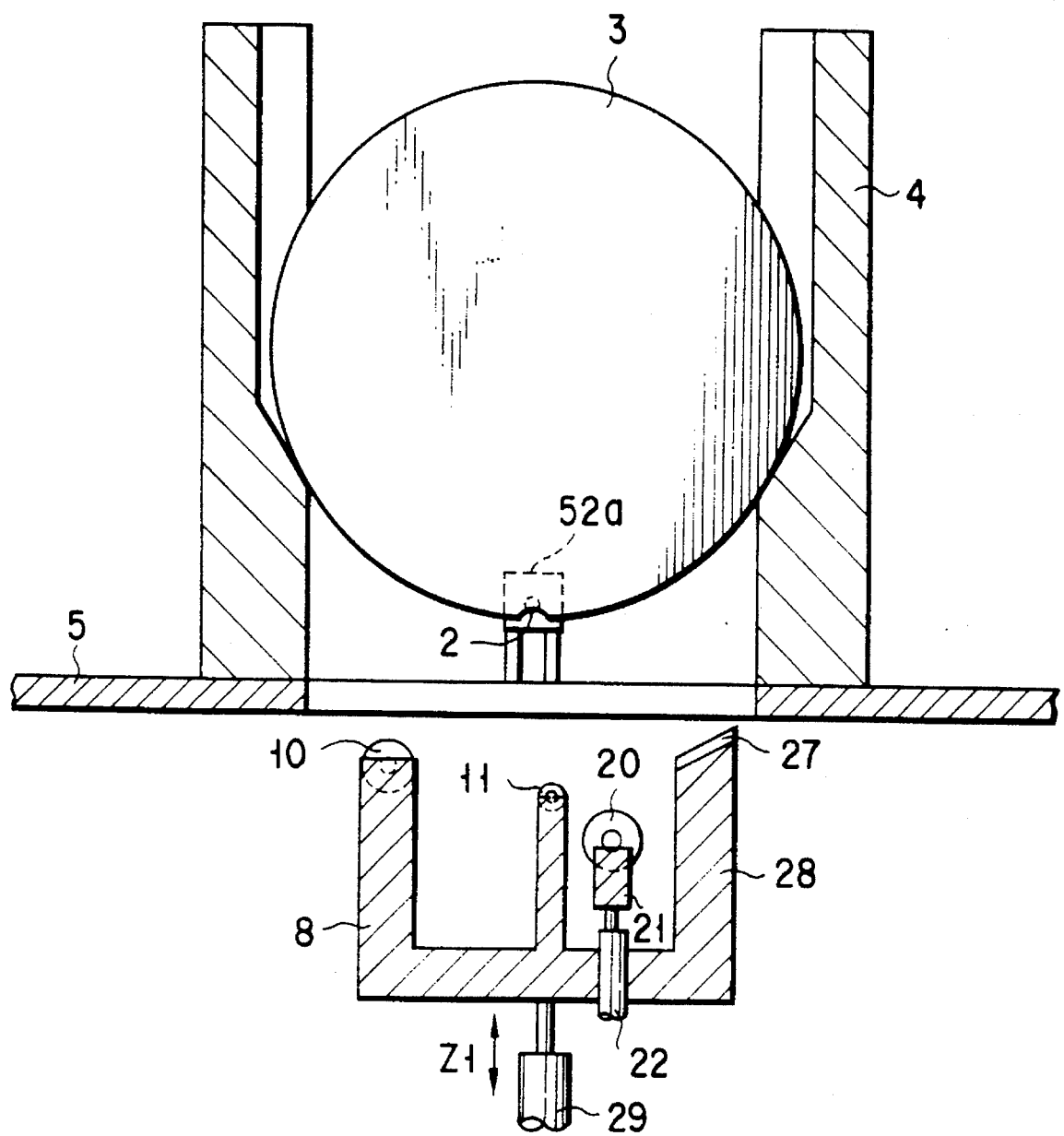
FIG. 9 is schematic sectional view showing the notch position aligning mechanism with a sensor unit in FIG. 1.
Figure 10:
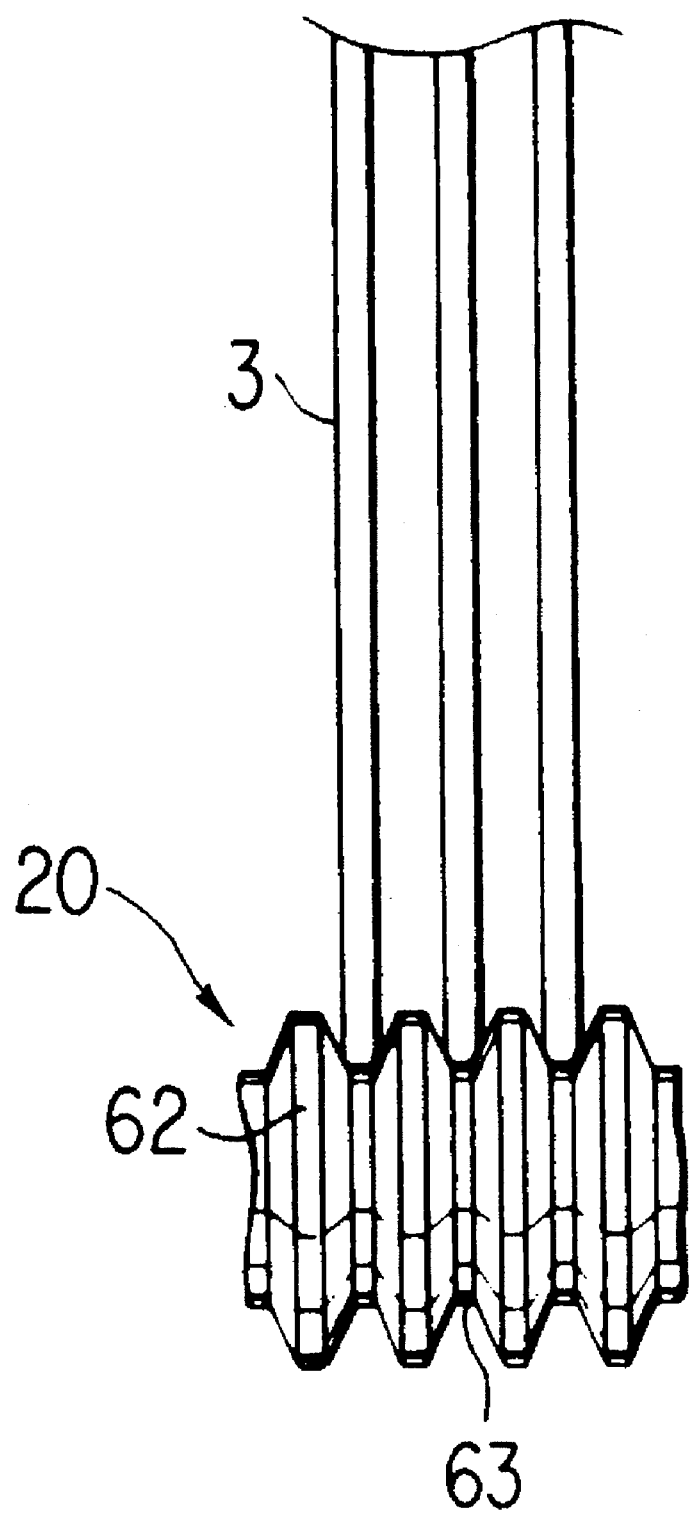
FIG. 10 is a partial enlarged view showing a notch moving shaft.

As shown in FIGS. 2 and 9, a sensor unit 52 for detecting the alignment state of the notches 2 of the wafers 3 is arranged on the base 5. The sensor unit 52, for example, is constituted by an LED 52a and a photodiode 52b. The LED 52a and the photodiode 52b are arranged to oppose each other at positions where they can detect the aligned state of the notches 2. In addition, the motors 15 and 24 and the air cylinders 22 and 29 are connected to a drive control unit 50. The drive control unit 50 drives and controls the motors 15 and 24 and the air cylinders 22 and 29 on the basis of information from the sensor unit 52.

A case wherein the plurality of wafers 3 stored in the cassette 4 are aligned in a predetermined state using the notch aligning mechanism 7 having the above arrangement will be described below with reference to FIGS. 6 and 7.

When the shaft of the air cylinder 29 extends, the base 8 is moved upward into the cassette 4 through the opening 6 of the base 5, and the wafers 3 stored in the cassette 4 are fitted in the annular grooves 44 of the idle pulleys 43 of the driven rotary member 10 and the annular grooves 13 of the drive shaft 11. The wafers 3 are lifted upward by the driven rotary member 10 and the drive shaft 11 and spaced apart from the cassette 4. At this time, clearances each having a size of about 0.5 mm are formed between the support member 28 and the wafers 3 to prevent the support member 28 from being in contact with the wafers 3. More specifically, the level of the support member 28, the width of each groove 27, and the shape of the end portion of the support member 28 are set such that the support member 28 is not brought into contact with the wafers 3 while the wafers 3 are lifted upward by the driven rotary member 10 and the drive shaft 11. Note that, in this case, the base 21 having the notch moving shaft 20 is arranged at a position where the notch moving shaft 20 is not brought into contact with the wafer 3. This state is shown in FIG. 6.

In this state, the drive shaft 11 is rotated by a rotational driving force from the motor 15. The rotational speed of the drive shaft 11 is set to be 50 rpm. When the drive shaft 11 is rotated, the wafers 3 are rotated in a e direction together with the idle pulleys 43. The wafers 3 are shifted downward when the notches 2 thereof are fitted in the annular grooves 13 of the drive shaft 11, and the wafers 3 are received by the grooves 27 of the support member 28. In this manner, the rotation of the wafers 3 is stopped. In a state wherein the wafers 3 are stored in the cassette 4, the positions of the notches 2 of the wafers 3 are different from each other. For this reason, the wafers 3 respectively have different times required for stopping the rotation of the wafers 3. That is, the rotational motions of the wafers are independently stopped.

Even when the rotation of some wafers 3 is stopped such that the corresponding wafers 3 are received by the grooves 27 of the support member 28, the drive shaft 11 is rotated until the rotation of all the wafers 3 is stopped, i.e., until the notches 2 of all the wafers 3 are fitted in the annular grooves 13 of the drive shaft 11. The rotational time of the drive shaft 11 is set by a timer.

In a state wherein the notches 2 of the wafers 3 are fitted in the annular grooves 13 of the drive shaft 11, a predetermined clearance (about 0.1 to 1 mm) formed by the difference between the diameter of each notch 2 and the diameter of each wafer 3 is formed between the notch 2 and the drive shaft 11. Therefore, the rotating drive shaft 11 is prevented from being rubbed, more than necessary, with the notches 2 of the wafers 3 which are stopped in advance by fitting the notches 2 in the annular grooves 13 of the drive shaft 11.

The rotation of the wafers 3 is stopped, the rotation of the idle pulleys 43 is stopped in response to the stop of the rotation of the wafers 3. Therefore, the idle pulleys 43 are prevented from being rubbed with the wafers 3 more than necessary. Note that FIG. 7 shows a state wherein the notches 2 of the wafers 3 are fitted in the annular grooves 13 of the drive shaft 11.

When the rotation of all the wafers 3 is stopped, i.e., the notches 2 of all the wafers 3 are fitted in the annular grooves 13 of the drive shaft 11, the drive control unit 50 stops the rotation of the motor 15. For this reason, the rotation of the drive shaft 11 is stopped. Thereafter, the base 8 is once moved downward, and it is detected by the sensor unit 52 arranged on the base 5 whether or not all of the notches 2 of the wafers 3 are aligned. Note that, in this case, Whether or not all the notches 2 of the wafers 3 are aligned is recognized by checking, for example, whether or not light from the LED 52a reaches the photodiode 52b through the notches 2 of the wafers 3. If all of the notches 2 of the wafers 3 are not aligned, the base 8 is moved upward again and the alignment of positions of the notches 2 is carried out in the same manner as described above. On the other hand, if all of the notches 2 of the wafers 3 are recognized to be aligned, the drive control unit 50 drives the air cylinder 22. In this manner, the drive shaft of the air cylinder 22 extends to move the shaft base 21 upward. In this case, the shaft base 21 is moved upward until the level of the notch moving shaft 20 becomes equal to the level of the driven rotary member 10. In this manner, all the wafers 3 are supported by the notch moving shaft 20 and the driven rotary member 10 to form predetermined gaps between the drive shaft 11 and the wafers 3. In addition, at this time, the wafers 3 are released from the support of the grooves 27 of the support member 28.

In this state, the notch moving shaft 20 is rotated by a driving force from the motor 24, and the notch 2 of each wafer 3 is moved to a predetermined position, e.g., a position immediately above the wafer. Thereafter, the drive shaft of the air cylinder 29 contracts to move the base 8 to the lower portion of the opening 6 of the base 5. In this moving operation, the wafers 3 are received by the cassette 4, thereby completing an aligning process for the plurality of wafers 3.

As has been described above, in the notch aligning mechanism 7 of this embodiment, when the notches 2 of the wafers 3 are fitted on the drive shaft 11, and the wafers 3 are supported by the grooves 27 of the support member 28, the rotation of the wafers 3 is stopped. At this time, predetermined clearances are formed between the notches 2 and the drive shaft 11. For this reason, even when the drive shaft 11 is rotated, the drive shaft 11 is prevented from being rubbed with the notches 2 more than necessary. In addition, when the rotation of the wafers 3 is stopped, the rotation of the idle pulleys 43 are stopped in response to the stop of the rotation of the wafers 3. For this reason, the idle pulleys 43 are prevented from being rubbed with the wafers 3 more than necessary.

According to the notch aligning mechanism 7 of this embodiment, in an aligning process for the wafers 3, the wafers 3 can be prevented, as much as possible, from being rubbed with other members. For this reason, peeling of films formed on the wafers 3 or chipping occurring due to damage to the wafers 3 can be prevented. Therefore, dust which is formed by peeling of films or damage to the wafers 3 and floats in the air can be prevented from adhering to devices formed on the wafers 3, and the yield of the wafers 3 can be increased.

The above notch aligning mechanism 7 can be arranged in a device such as an annealing apparatus, a plasma etching apparatus, a CVD apparatus, or an ion-implantation apparatus.

In this embodiment, although the drive shaft 11 is formed by forming a polytetrafluoroethylene-based coating on a stainless steel rod, the drive shaft 11 may be formed such that a triflurochloroethylene sleeve is press-fitted on a stainless steel rod. In addition, the materials of the members such as the notch moving shaft 20, the driven rotary member 10, and the support member 28 are not limited to the embodiment. These members may consist of any material which does not generate dust.

In this embodiment, the notch aligning mechanism 7 for aligning the notches 2 formed in the edge portions of the wafers 3 has been exemplified. However, when straight orientation flat portions are respectively formed in the wafers 3, the arrangement of the mechanism according to this embodiment can be applied to a case wherein the positions of the orientation flat portions are aligned, as a matter of course.

The driven rotary member 10 may have any arrangement in which the plurality of wafers 3 can be independently supported and can be independently rotated. In addition, the drive shaft 11 and the notch moving shaft 20 may have any arrangement in which the wafers can be supported and rotated.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A notch position aligning mechanism comprising:

a base which is vertically movable and which is inserted into a cassette through a lower opening of the cassette for storing a plurality of targets to be aligned having notches formed in edge portions of the targets;

rotating/supporting means, including a first rotary member, driving means for rotating the first rotary member, and a second rotary member, for supporting and rotating the targets with the targets spaced from a portion of the cassette, the first rotary member being arranged on said base and having a plurality of fitting grooves which allow the notches of the targets to be fitted in the fitting grooves, the second rotary member being rotatable and arranged on said base; and a support member, arranged on said base, for supporting the targets when the notches of the targets are fitted in the fitting grooves of the first rotary member, such that the targets are non-rotatable when the notches of the targets are fitted in the fitting grooves of the first rotary member, wherein the second rotary member includes a rigid shaft fixed to said base and extending in a direction along which the targets are arranged in the cassette, the second member further including a plurality of idle pulleys, fitted over a full length of the rigid shaft, for supporting the targets, respectively, and the idle pulleys are individually rotated and stopped by rotation and stoppage of the targets which are allowed to be rotated by the first rotary member.

2. A mechanism according to claim 1, wherein the fitting grooves of the first rotary member are formed such that when the fitting grooves of the first rotary member and the notches of the targets are fitted together, clearances are provided between the fitting grooves and the notches.

3. A mechanism according to claim 1, wherein each of the targets is fitted in a respective fitting groove of the first rotary member.

4. A mechanism according to claim 1, wherein the first rotary member extends in a direction along which the targets are arranged in the cassette, and serves as a rotation shaft.

5. A mechanism according to claim 1, wherein the first rotary member is formed of stainless steel, and a peripheral surface of the first rotary member is coated with a polytetrafluoroethylene base.

6. A mechanism according to claim 1, wherein the first rotary member is formed of stainless steel, and a peripheral surface of the rotary member is covered by a sleeve formed of trifluorochloroethylene.

7. A mechanism according to claim 1, further comprising a third rotary member, vertically movably provided inside said base, for moving the targets fitted in the fitting grooves of the first rotary member in cooperation with said second rotary member, thereby supporting the targets in cooperation with said second rotary member, with the targets separated from said first rotary member.

8. A mechanism according to claim 1, further comprising detecting means for detecting that notches of the targets and the fitting grooves of the first rotary member are fitted together.

9. A method of aligning notch positions, comprising the steps of:

moving a first rotary member and a second rotary member, to support targets to be aligned, from below, by said first and second rotary members, with the targets spaced from a portion of a cassette, said first rotary member having fitting grooves which are formed such that the fitting grooves are arranged in a longitudinal axis of said first rotary member, and in which the targets are allowed to be fitted, and wherein the second rotary member includes idle pulleys, which are fitted on the second rotary member over a full length thereof and which are allowed to be rotated and stopped by the rotation and stoppage of the targets, with said idle pulleys individually supporting the targets;

rotating the targets by said first and second rotary members until notches formed in edge portions of the targets and the fitting grooves of the first rotary member are fitted together;

supporting the targets by a third rotary member and the second rotary member, with the targets separated from the first rotary member, after the notches of the targets and the fitting grooves of the first rotary member are fitted together; and rotationally moving the notches aligned with each other by rotating the targets by the second and third rotary members.

* * * * *